(12) United States Patent
Byun

(10) Patent No.: US 7,190,200 B2
(45) Date of Patent: Mar. 13, 2007

(54) DELAY LOCKED LOOP CAPABLE OF PERFORMING RELIABLE LOCKING OPERATION

(75) Inventor: Gyung-Su Byun, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 128 days.

(21) Appl. No.: 10/983,504

(22) Filed: Nov. 8, 2004

(65) Prior Publication Data

US 2005/0110542 A1    May 26, 2005

(30) Foreign Application Priority Data

Nov. 24, 2003    (KR) .................... 10-2003-0083624

(51) Int. Cl.
*H03L 7/06* (2006.01)
(52) U.S. Cl. .................. 327/158; 327/155; 327/161
(58) Field of Classification Search .............. None
See application file for complete search history.

(56) References Cited

U.S. PATENT DOCUMENTS

| | | | | |
|---|---|---|---|---|
| 5,179,303 A | * | 1/1993 | Searles et al. ............ 327/277 |
| 5,847,616 A | * | 12/1998 | Ng et al. .................... 331/57 |
| 6,028,490 A | * | 2/2000 | Komatsu .................... 331/57 |
| 6,815,990 B2 | * | 11/2004 | Lee ............................ 327/158 |
| 2002/0067913 A1 | | 6/2002 | Ando et al. .................. 386/95 |

FOREIGN PATENT DOCUMENTS

| | | |
|---|---|---|
| JP | 2002-300030 | 10/2002 |
| KR | 2001-0098685 | 8/2001 |

* cited by examiner

*Primary Examiner*—Timothy P. Callahan
*Assistant Examiner*—An T. Luu
(74) *Attorney, Agent, or Firm*—F.Chau & Associates, LLC

(57) ABSTRACT

A delay locked loop capable of performing a reliable locking operation is provided that includes a phase controller, which controls a phase of a reference clock signal in response to first and second phase control signals, and a phase detector, which compares the phase of the reference clock signal to a phase of a feedback clock signal and outputs the first and second phase control signals to match the phase of the reference clock signal and the phase of the feedback clock signal, where the phase detector keeps the length of a detecting window constant in response to a current signal despite changes in external voltage, temperature, and the manufacturing process.

21 Claims, 6 Drawing Sheets

DELAY LOCKED LOOP CAPABLE OF PERFORMING RELIABLE LOCKING OPERATION

CROSS-REFERENCE TO RELATED APPLICATION

This application claims foreign priority under 35 U.S.C. § 119 to Korean Patent Application No. 2003-83624, filed on Nov. 24, 2003, in the Korean Intellectual Property Office, the disclosure of which is incorporated herein by reference in its entirety.

1. Field of the Invention

The present disclosure relates to delay locked loops, and more particularly, to a delay locked loop capable of performing a reliable locking operation.

2. Description of the Related Art

In a background example, a semiconductor memory device, such as a double data-rate synchronous DRAM semiconductor device, includes a delay locked loop in order to reduce skew between a clock and data.

FIG. 1 is a block diagram of a background example delay locked loop, indicated generally by the reference numeral 100. With reference to FIG. 1, the delay locked loop 100 includes a phase controller 110, which controls a phase of a reference clock signal REFCLK, and a phase detector 120, which compares the phase of the reference clock signal REFCLK to a feedback clock signal FBCLK output from the phase controller 110 and outputs first and second phase control signals PCS1 and PCS2 to the phase controller 110.

The phase detector 120 includes a detecting window controller 130, which determines a rising edge and a falling edge of a locking operation in order to compare the reference clock signal REFCLK and the feedback clock signal FBCLK, and a phase sensing unit 140, which outputs the first and second phase control signals PCS1 and PCS2 controlling the phase controller 110 in response to an output of the detecting window controller 130.

FIG. 2 is a circuit diagram of the phase detector 120 of FIG. 1, which includes the detecting window controller 130 and the phase sensing unit 140 of FIG. 1. The detecting window controller 130 generates a delay feedback clock signal FBCLK_D by delaying the feedback clock signal FBCLK.

The detecting window controller 130 includes a plurality of inverters INV1, INV2, INV3, and INV4 to delay the feedback clock signal FBCLK. The inverters INV1, INV2, INV3, and INV4 include a plurality of resistors R11, R12, R21, R22, R31, R32, R41, and R42 connected between a power supply voltage VDD and the ground voltage VSS. The time when the delay feedback clock signal FBCLK_D is output is controlled using the resistors R11, R12, R21, R22, R31, R32, R41 and R42, and internal transistors (not shown) of the inverters INV1, INV2, INV3, and INV4.

The phase sensing unit 140 includes a first comparator COM1 and a first latch unit LAT1, which output the first phase control signal PCS1 after comparing and latching the reference clock signal REFCLK and the feedback clock signal FBCLK. Also, the phase sensing unit 140 includes a second comparator COM2 and a second latch unit LAT2, which output the second phase control signal PCS2 after comparing and latching the reference clock signal REFCLK and the delay feedback clock signal FBCLK_D.

Control of a phase of the reference clock signal REFCLK by the phase controller 110 is determined according to logic levels of the first phase control signal PCS1 and the second phase control signal PCS2. The time taken from when the detecting window controller 130 receives the feedback clock signal FBCLK to when it outputs the delay feedback clock signal FBCLK_D is referred to as a detecting window.

FIG. 3 is a timing graph, indicated generally by the reference numeral, 300, of an operation of the phase detector 120 of FIG. 1 showing the detecting window "DW". When the feedback clock signal FBCLK is first input to the phase detector 120, a phase difference between the feedback clock signal FBCLK and the reference clock signal REFCLK is large as shown in FBCLK(i) of FIG 3. The detecting window DW is indicated with hatching. It is assumed that the feedback clock signal FBCLK synchronizes with the reference clock signal REFCLK when a rising edge PFB of the feedback clock signal FBCLK is matched to a rising edge PREF of the reference clock signal REFCLK.

When the phase detector 120 controls a phase of the reference clock signal REFCLK input to the phase controller 110 by generating the first phase control signal PCS1 and the second phase control signal PCS2, a phase of the feedback clock signal FBCLK output from the phase controller 110 is also controlled.

In order for the phase of the feedback clock signal FBCLK to synchronize with the phase of the reference clock signal REFCLK, the feedback clock signal FBCLK is moved to the right gradually as shown in FBCLK(i) and FBCLK(ii) of FIG. 3. When the rising edge PREF of the reference clock signal REFCLK goes into the detecting window DW while the feedback clock signal FBCLK is moved to the right, the phase controller 110 starts to perform a fine phase locking operation. When a certain time has passed after starting of the fine phase locking operation, the phase of the feedback clock signal FBCLK synchronizes with the phase of the reference clock signal REFCLK as shown in FBCLK(iii) of FIG. 3.

FIG. 4 is a graph indicated generally by the reference numeral 400 showing a phase locking operation of the delay locked loop 100 of FIG. 1. When a big difference exists between the phase of the feedback clock signal FBCLK and the phase of the reference clock signal REFCLK as shown in FBCLK(i) of FIG. 3, the phase controller 110 adjusts the phase of the feedback clock signal FBCLK by making coarse adjustments to the phase in large phase units (LPUs), as illustrated in a time division (1) of FIG. 4. The large phase unit (LPU) is about 0.5° or 0.6° in FIG. 4. However, the LPU can be varied for different semiconductor devices including the delay locked loop 100.

When the rising edge PREF of the reference clock signal REFCLK goes into the detecting window DW as shown in FBCLK(ii) of FIG. 3, the phase controller 110 adjusts the phase of the feedback clock signal FBCLK by making fine adjustments to the phase in small phase units (SPUs) in a time division (2) of FIG. 4. The small phase unit (SPU) is a much smaller phase unit than the large phase unit (LPU), and can also be varied for different semiconductor devices including the delay locked loop 100.

The detecting window DW is a certain time division (or phase division) starting from when the phase controller 110 starts to adjust the phase of the feedback clock signal FBCLK in small phase units (SPUs) so that the phase of the feedback clock signal FBCLK synchronizes with the phase of the reference clock signal REFCLK.

A phase division (3) of the detecting window DW and the time division (2) of the detecting window DW are displayed in FIG. 4. The detecting window controller 130 of FIG. 2 includes a plurality of inverters INV1, INV2, INV3, and INV4, which are made up of transistors (not shown), and a plurality of resistors R11, R12, R21, R22, R31, R32, R41, and R42. Very large variations in the characteristics of the transistors (not shown) and the plurality of resistors R11, R12, R21, R22, R31, R32, R41, and R42 occur due to changes in external voltage, temperature, and the manufacturing process. Therefore, the detecting window DW made by the detecting window controller 130 varies according to changes in the external voltage, temperature, and the manufacturing process.

That is, in the detecting window controller 130 including the transistors (not shown) and the plurality of resistors R11, R12, R21, R22, R31, R32, R41, and R42, the time taken from when the feedback clock signal FBCLK is received to when the delay feedback clock signal FBCLK_D is output becomes irregular due to changes in the external voltage, temperature, and the manufacturing process.

The irregularity of the time causes several problems in a phase locking operation of the delay locked loop 100. FIG. 5 shows timing changes of the detecting window DW, indicated generally by the reference numeral 500.

The length of the detecting window DW when the outside conditions are normal is indicated by the numeral (1).

A case where the detecting window DW is longer due to degradation of the outside conditions is indicated by the numeral (2). If the characteristics of the transistors (not shown) and the plurality of resistors R11, R12, R21, R22, R31, R32, R41, and R42 are worse due to the degradation of the outside conditions, the time that the feedback clock signal FBCLK is delayed in the detecting window controller 130 is longer and the detecting window DW is also longer. Then, since the time of performing a fine locking operation is longer in the delay locked loop 100, much time is taken until the phase of the feedback clock signal FBCLK synchronizes with the phase of the reference clock signal REFCLK.

A case where the detecting window DW is shorter due to improvement of the outside conditions is indicated by the numeral (3). If the characteristics of the transistors (not shown) and the plurality of resistors R11, R12, R21, R22, R31, R32, R41, and R42 are better due to the improvement of the outside conditions, the time that the feedback clock signal FBCLK is delayed in the detecting window controller 130 is shorter and the detecting window DW is also shorter.

Unfortunately, since the phase detector 120 does not recognize the shortened detecting window DW and a fine locking operation is not performed normally, problems occur in a phase locking operation of the delay locked loop 100.

SUMMARY OF THE INVENTION

The present disclosure provides a delay locked loop capable of keeping a detecting window constant, despite variations in voltage, temperature, and the manufacturing process.

According to an aspect of the present disclosure, there is provided a delay locked loop including a phase controller, which controls a phase of a reference clock signal in response to first and second phase control signals, and a phase detector, which compares the phase of the reference clock signal to a phase of a feedback clock signal and outputs the first and second phase control signals, which are used by the phase controller to match the phase of the reference clock signal and the phase of the feedback clock signal, wherein the phase detector keeps the length of a detecting window constant in response to a current signal.

The phase controller performs a fine phase locking operation to progressively adjust the phase of the reference clock signal by a small phase unit and a coarse phase locking operation to progressively adjust the phase of the reference clock signal by a large phase unit in response to the first and second phase control signals in order to match the phase of the reference clock signal and the phase of the feedback clock signal.

The detecting window lasts for a predetermined period of time and starts from when the phase controller starts to perform the fine phase locking operation. More specifically, the detecting window is a phase difference between a rising edge of the feedback clock signal and a rising edge of a delay feedback clock signal.

The current of the current signal is constant.

The phase detector includes a detecting window controller, which generates the delay feedback clock signal that delays the feedback clock signal for a predetermined time in response to the current signal, and a phase sensing unit, which generates the first phase control signal by comparing the phase of the feedback clock signal to the phase of the reference clock signal and generates the second phase control signal by comparing the phase of the delay feedback clock signal to the phase of the reference clock signal.

If a logic level of the first phase control signal stays at a first level and a logic level of the second phase control signal is transited to a second level from the first level, the fine phase locking operation is performed in the phase controller.

The detecting window controller includes a first differential amplifier, which receives and amplifies the feedback clock signal and an inverted feedback clock signal that is an inverted version of the feedback clock signal, and a second differential amplifier, which receives and amplifies an output of the first differential amplifier and outputs the amplified signal as the delay feedback clock signal.

The first differential amplifier and the second differential amplifier keep the delay time, from when the feedback clock signal is received to when the delay feedback clock signal is output, constant.

The detecting window controller may include a plurality of differential amplifier pairs, each pair composed of the first differential amplifier and the second differential amplifier.

The first differential amplifier includes a first resistor, a first terminal of which is connected to a power source voltage, a first transistor, a first terminal of which is connected to a second terminal of the first resistor and a gate of which receives the feedback clock signal, a second resistor, a first terminal of which is connected to the power source voltage, a second transistor, a first terminal of which is connected to a second terminal of the second resistor and a gate of which receives the inverted feedback clock signal, and a first driving transistor, a first terminal of which is commonly connected to a second terminal of the first transistor and a second terminal of the second transistor and a gate of which receives the current signal.

The second differential amplifier includes a third resistor, a first terminal of which is connected to the power source voltage, a third transistor, a first terminal of which is connected to a second terminal of the third resistor and a gate of which is connected to the first terminal of the first transistor, a fourth resistor, a first terminal of which is connected to the power source voltage, a fourth transistor, a first terminal of which is connected to a second terminal of the fourth resistor and a gate of which is connected to the first terminal of the second transistor, and a second driving transistor, a first terminal of which is commonly connected to a second terminal of the third transistor and a second terminal of the fourth transistor and a gate of which receives the current signal.

The delay feedback clock signal is output from the first terminal of the third transistor.

The first differential amplifier includes a first operation control transistor, which is connected in series between the second terminal of the first transistor and a first terminal of the first driving transistor and a gate of which receives an operation control signal, and a second operation control transistor, which is connected in series between the second terminal of the second transistor and the first terminal of the first driving transistor and a gate of which receives the operation control signal.

The second differential amplifier includes a third operation control transistor, which is connected in series between the second terminal of the third transistor and a first terminal of the second driving transistor and a gate of which receives the operation control signal, and a fourth operation control transistor, which is connected in series between the second terminal of the fourth transistor and the first terminal of the second driving transistor and a gate of which receives the operation control signal.

The first differential amplifier and the second differential amplifier are turned on/off in response to the operation control signal.

The phase sensing unit includes a first comparator, which compares the phase of the reference clock signal to the phase of the feedback clock signal, a first latch, which latches an output of the first comparator and outputs the latched signal as the first phase control signal, a second comparator, which compares the phase of the reference clock signal to the phase of the delay feedback clock signal, and a second latch, which latches an output of the second comparator and outputs the latched signal as the second phase control signal.

The delay locked loop further includes a current generator, which outputs the current signal, and the current generator generates the current of the current signal constant despite changes in external voltage, temperature, and the manufacturing process.

The current generator increases or decreases the current of the current signal output from a mode register set (MRS).

According to another aspect of the present disclosure, there is provided a delay locked loop for matching a phase of a reference clock signal and a phase of a feedback clock signal, including: a detecting window controller, which generates the delay feedback clock signal that delays a feedback clock signal for a predetermined time in response to a current signal; and a phase sensing unit, which generates a first phase control signal that controls the phase of the reference clock signal by comparing a phase of the feedback clock signal to the phase of the reference clock signal and a second phase control signal that controls the phase of the reference clock signal by comparing the phase of the delay feedback clock signal to the phase of the reference clock signal.

The detecting window controller keeps the delay time, from when the feedback clock signal is received by the current signal to when the delay feedback clock signal is output, constant.

The delay locked loop further includes a current generator, which outputs the current signal, and the current generator generates the current of the current signal constant despite changes in external voltage, temperature, and the manufacturing process.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF PREFERRED EMBODIMENTS

Figure 6:
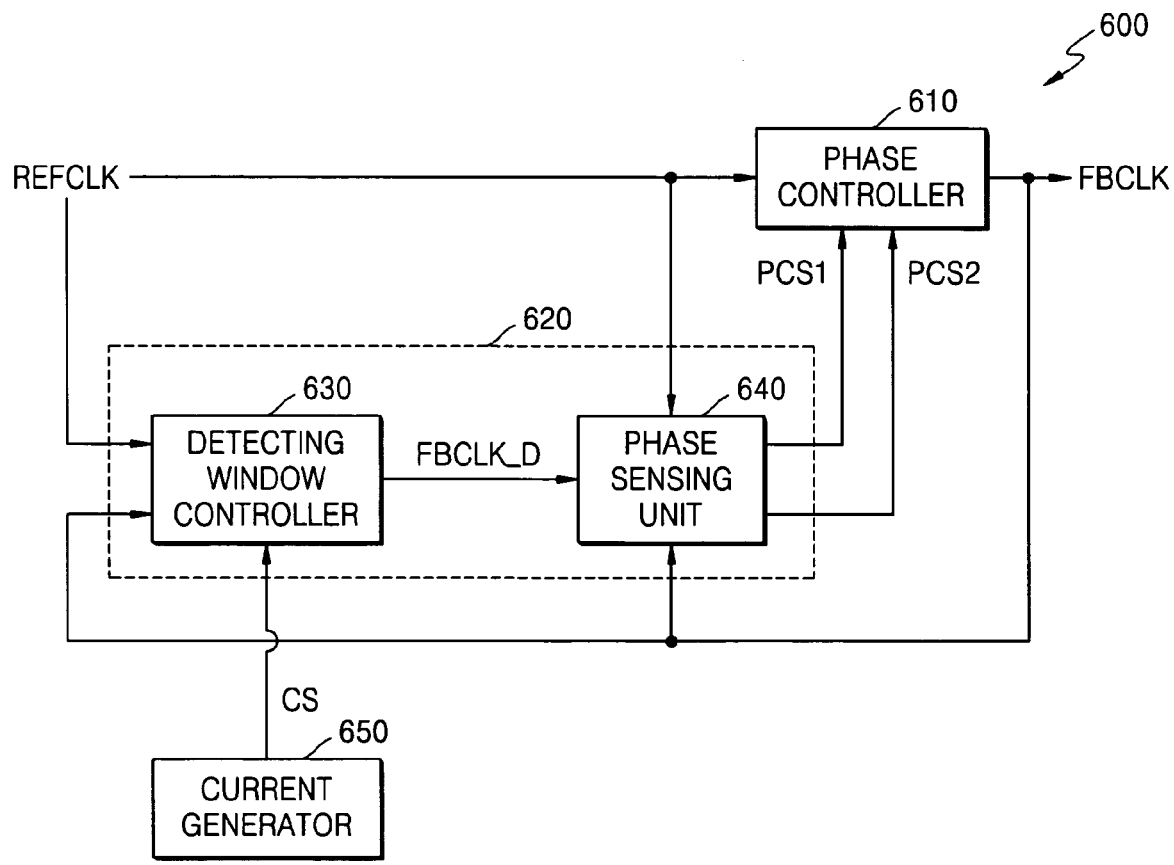
FIG. 6 is a block diagram of a delay locked loop according to an embodiment of the present disclosure.
Figure 7:
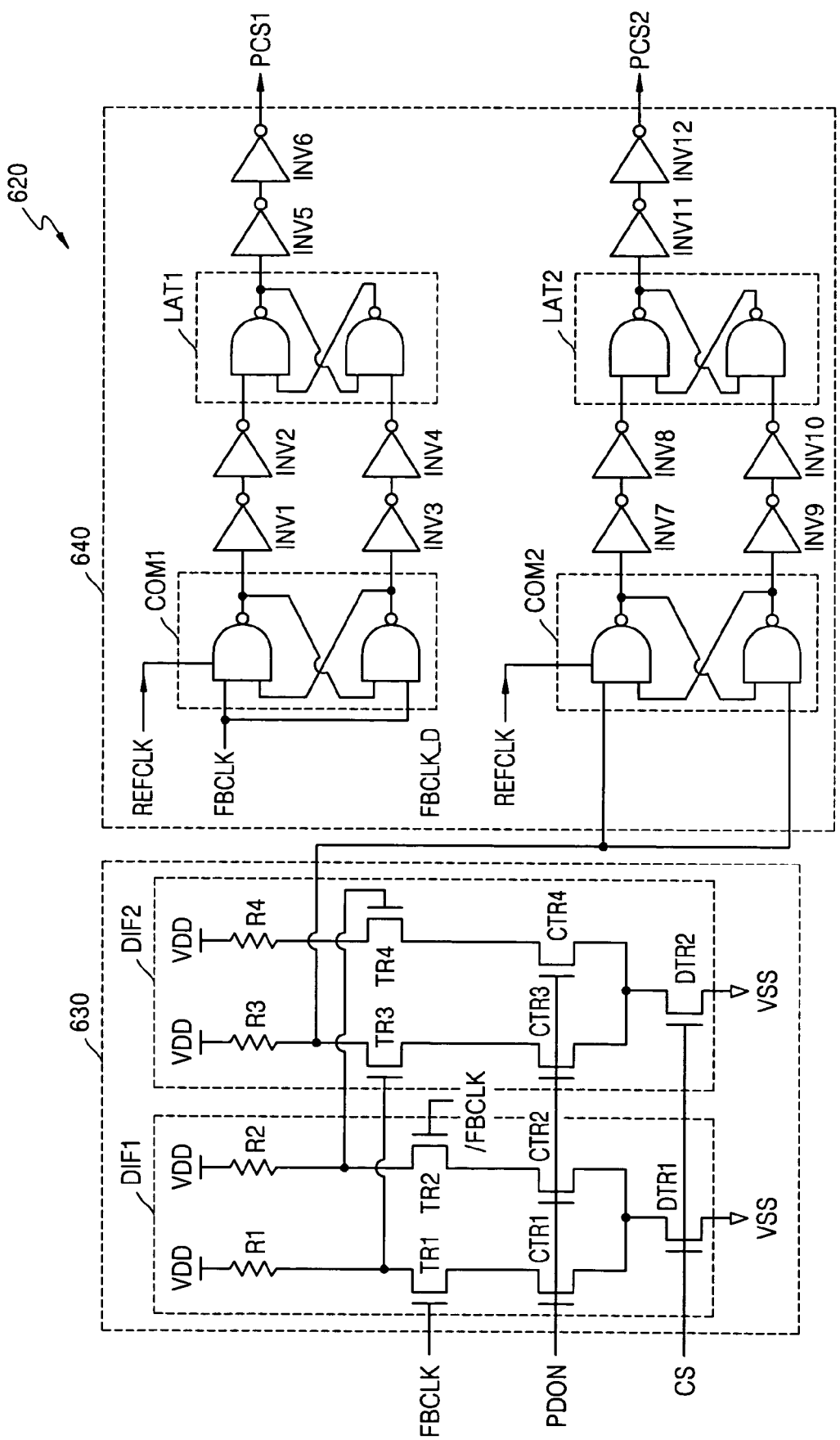
FIG. 7 is a circuit diagram of a phase detector of FIG. 6.

FIG. 6 is block diagram of a delay locked loop according to an embodiment of the present disclosure; and FIG. 7 is a circuit diagram of a phase detector of FIG. 6.

With reference to FIG. 6, a delay locked loop 600 according to an embodiment of the present disclosure includes a phase controller 610 and a phase detector 620.

The phase controller 610 controls a phase of a reference clock signal REFCLK in response to first and second phase control signals PCS1 and PCS2. The phase detector 620 compares the phase of the reference clock signal REFCLK to a phase of a feedback clock signal FBCLK and outputs the first and second phase control signals PCS1 and PCS2, which are used to match the phase of the reference clock signal REFCLK and the phase of the feedback clock signal FBCLK. The phase detector 620 keeps the length of a detecting window constant in response to a current signal CS.

The delay locked loop 600 further includes a current generator 650, which outputs the current signal CS. The current generator 650 generates the current signal CS so that it always has a constant current despite variations in external voltage, temperature, and the manufacturing process.

The current generator 650 increases or decreases the current of the current signal CS output from a mode register set (MRS).

In order to solve the problem of the conventional delay locked loop 100 in which the detecting window DW becomes longer or shorter due to changes in voltage, temperature, and the manufacturing process, the delay locked loop 600 according to an embodiment of the present disclosure includes the current generator 650, which generates the current signal CS so that it always has a constant current despite variations in external voltage, temperature, and the manufacturing process.

A detecting window controller 630 includes differential amplifiers DIF1 and DIF2 controlled by the current signal CS output from the current generator 650.

In a differential amplifier, if input bias current is constant, the time from receiving an input signal to outputting the signal is constant. Therefore, if the feedback clock signal FBCLK is used as the input signal of the differential amplifiers DIF1 and DIF2 and the current signal CS output from the current generator 650 is used as a bias current, the time between receiving and outputting the feedback clock signal FBCLK in the detecting window controller 630 is constant.

Since the detecting window DW is a time interval from when the feedback clock signal FBCLK is received in the detecting window controller 630 to when it is output from the detecting window controller 630, the detecting window DW can be kept constant despite changes in external voltage, temperature, and the manufacturing process.

The detecting window controller 630 includes the first differential amplifier DIF1 and the second differential amplifier DIF2.

The first differential amplifier DIF1 receives and amplifies the feedback clock signal FBCLK and an inverted feedback clock signal /FBCLK that inverts the phase of the feedback clock signal FBCLK.

The first differential amplifier DIF1 includes a first resistor R1, a first terminal of which is connected to a power source voltage VDD, a first transistor TR1, a first terminal of which is connected to a second terminal of the first resistor R1 and a gate of which receives the feedback clock signal FBCLK, a second resistor R2, a first terminal of which is connected to the power source voltage VDD, a second transistor TR2, a first terminal of which is connected to a second terminal of the second resistor R2 and a gate of which receives the inverted feedback clock signal /FBCLK, and a first driving transistor DTR1, a first terminal of which is commonly connected to a second terminal of the first transistor TR1 and a second terminal of the second transistor TR2 and a gate of which receives the current signal CS.

The second differential amplifier DIF2 receives and amplifies an output of the first differential amplifier DIF1 and outputs the amplified signal as the delay feedback clock signal FBCLK_D.

The second differential amplifier DIF2 includes a third resistor R3, a first terminal of which is connected to the power source voltage VDD, a third transistor TR3, a first terminal of which is connected to a second terminal of the third resistor R3 and a gate of which is connected to the first terminal of the first transistor TR1, a fourth resistor R4, a first terminal of which is connected to the power source voltage VDD, a fourth transistor TR4, a first terminal of which is connected to a second terminal of the fourth resistor R4 and a gate of which is connected to the first terminal of the second transistor TR2, and a second driving transistor DTR2, a first terminal of which is commonly connected to a second terminal of the third transistor TR3 and a second terminal of the fourth transistor TR4 and a gate of which receives the current signal CS.

The delay feedback clock signal FBCLK_D is output from the first terminal of the third transistor TR3.

The first differential amplifier DIF1 and the second differential amplifier DIF2 receive the current signal CS through gates of the first and second driving transistors DTR1 and DTR2. The current of the current signal CS is kept constant despite changes in external conditions. Therefore, the time from receiving the feedback clock signal FBCLK in the first differential amplifier DIF1 to outputting the delay feedback clock signal FBCLK_D in the second differential amplifier DIF2 is constant. That is, since the detecting window DW lasts from a rising edge of the feedback clock signal FBCLK to a rising edge of the delay feedback clock signal FBCLK_D, the lasting time of the detecting window DW is constant.

The current generator 650, which generates the current signal CS having the constant current despite changes in external conditions, can increase or decrease the current of the output current signal CS by the MRS.

The time that the delay feedback clock signal FBCLK_D is output from the detecting window controller 630, that is, the detecting window DW can be adjusted according to increase or decrease of the current of the current signal CS.

Since a configuration of the current generator 650 will be understood by those of ordinary skill in the pertinent art, further detail is omitted for brevity.

The first differential amplifier DIF1 can further includes first and second operation control transistors CTR1 and CTR2. The first operation control transistor CTR1 is connected in series between the second terminal of the first transistor TR1 and a first terminal of the first driving transistor DTR1 and a gate of which receives an operation control signal PDON. The second operation control transistor CTR2 is connected in series between the second terminal of the second transistor TR2 and the first terminal of the first driving transistor DTR1 and a gate of which receives the operation control signal PDON.

The second differential amplifier DTF2 can further includes third and fourth operation control transistors CTR3 and CTR4. The third operation control transistor CTR3 is connected in series between the second terminal of the third transistor TR3 and a first terminal of the second driving transistor DTR2 and a gate of which receives the operation control signal PDON. The fourth operation control transistor CTR4 is connected in series between the second terminal of the fourth transistor TR4 and the first terminal of the second driving transistor DTR2 and a gate of which receives the operation control signal PDON.

The first through fourth operation control transistors CTR1, CTR2, CTR3, and CTR4 control the first differential amplifier DIF1 and the second differential amplifier DTF2. The first differential amplifier DIF1 and the second differential amplifier DTF2 are turned on/off in response to the operation control signal PDON. The operation control signal PDON is input from the outside in order to control the detecting window controller 630.

The detecting window controller 630 may include a plurality of differential amplifier pairs, each pair composed of the first differential amplifier DIF1 and the second differential amplifier DIF2. By connecting the plurality of the differential amplifier pairs in series, the time from receiving the feedback clock signal FBCLK to outputting the delay feedback clock signal FBCLK_D is longer. Therefore, the detecting window DW can be adjusted by changing the number of differential amplifier pairs.

A phase sensing unit 640 generates the first phase control signal PCS1 by comparing the phase of the feedback clock signal FBCLK to the phase of the reference clock signal REFCLK and generates the second phase control signal PCS2 by comparing the phase of the delay feedback clock signal FBCLK_D to the phase of the reference clock signal REFCLK.

The phase sensing unit 640 includes a first comparator COM1, a first latch LAT1, a second comparator COM2, and a second latch LAT2.

The first comparator COM1 compares the phase of the reference clock signal REFCLK to the phase of the feedback clock signal FBCLK. The first latch LAT1 latches an output of the first comparator COM1 and outputs the latched signal as the first phase control signal PCS1.

With reference to FIG. 7, the phase sensing unit 640 includes inverters INV1, INV2, INV3, and INV4 between the first comparator COM1 and the first latch LAT1, and also includes inverters INV5 and INV6 next to the first latch LAT1. The inverters INV1, INV2, INV3, and INV4 increase the driving ability of signals output from the first comparator COM1, and the inverters INV5 and INV6 increase the driving ability of signals output from the first latch LAT1.

The second comparator COM2 compares the phase of the reference clock signal REFCLK to the phase of the delay feedback clock signal FBCLK. The second latch LAT2 latches an output of the second comparator COM2 and outputs the latched signal as the second phase control signal PCS2.

Referring again to FIG. 7, the phase sensing unit 640 includes inverters INV7, INV8, INV9, and INV10 between the second comparator COM2 and the second latch LAT2, and also includes inverters INV11 and INV12 next to the second latch LAT2. The inverters INV7, INV8, INV9, and INV10 increase the driving ability of signals output from the second comparator COM2, and the inverters INV11 and INV12 increase the driving ability of signals output from the second latch LAT2.

Figure 1:
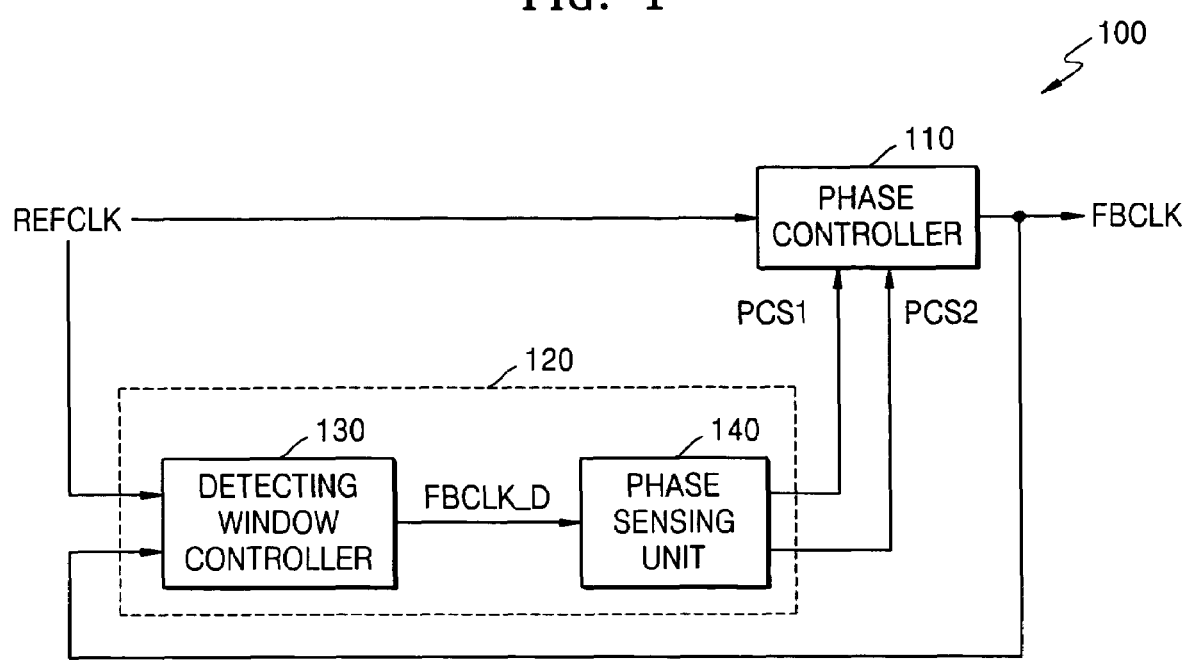
FIG. 1 is a block diagram of a conventional delay locked loop.
Figure 2:
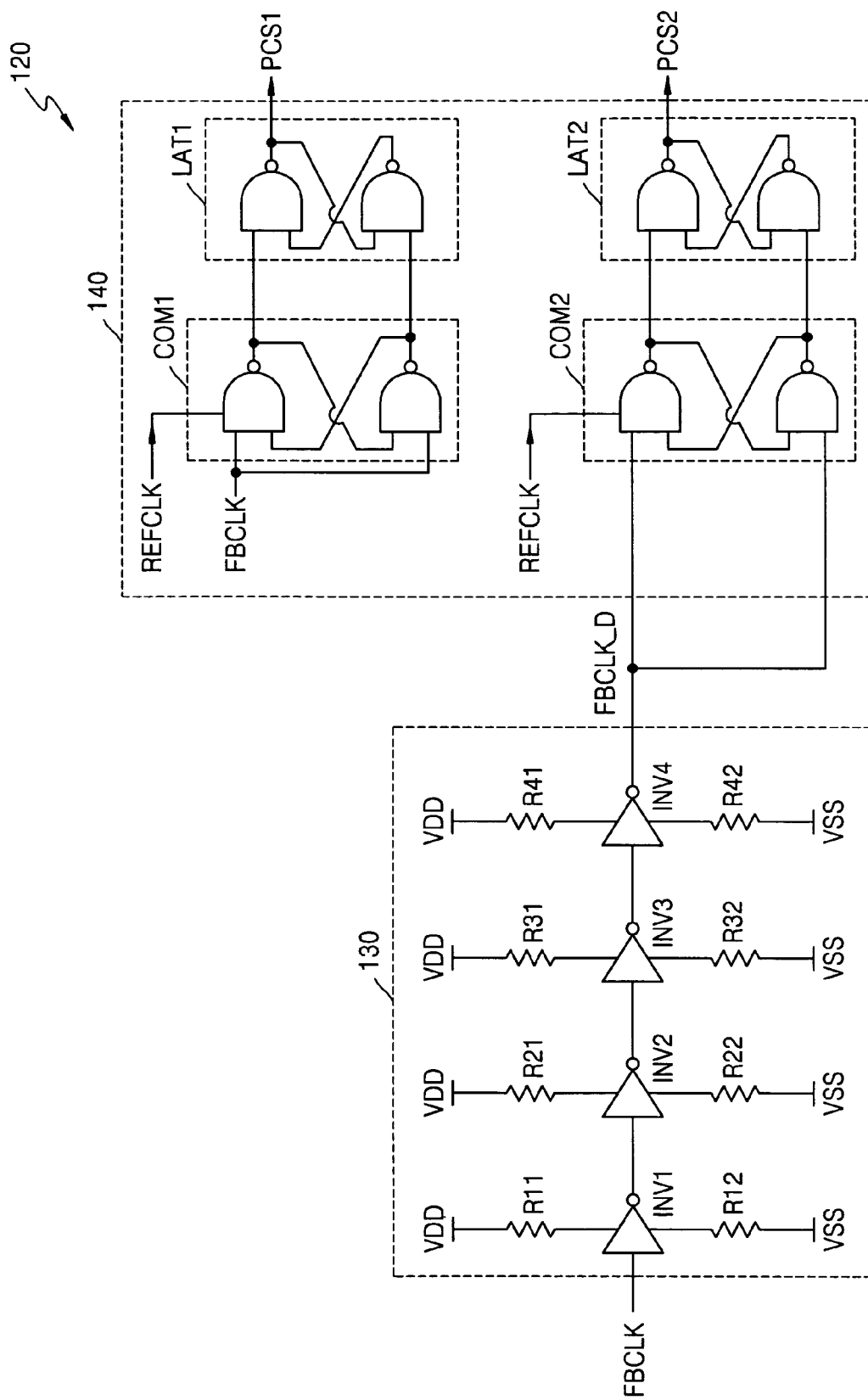
FIG. 2 is a circuit diagram of the detecting window controller and the phase sensing unit of FIG. 1.
Figure 3:
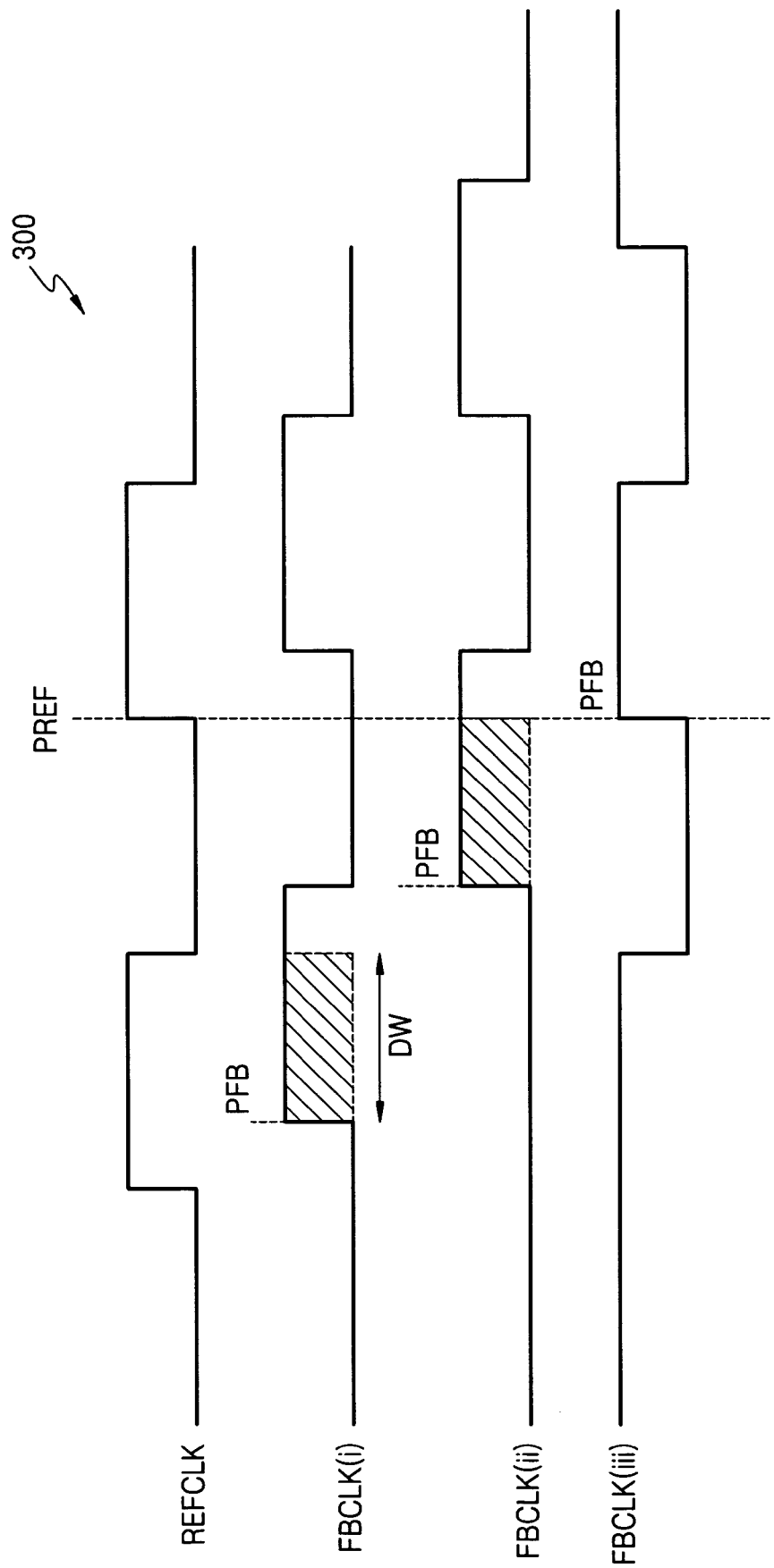
FIG. 3 is a timing graph of an operation of a phase detector of FIG. 1 showing the detecting window.
Figure 4:
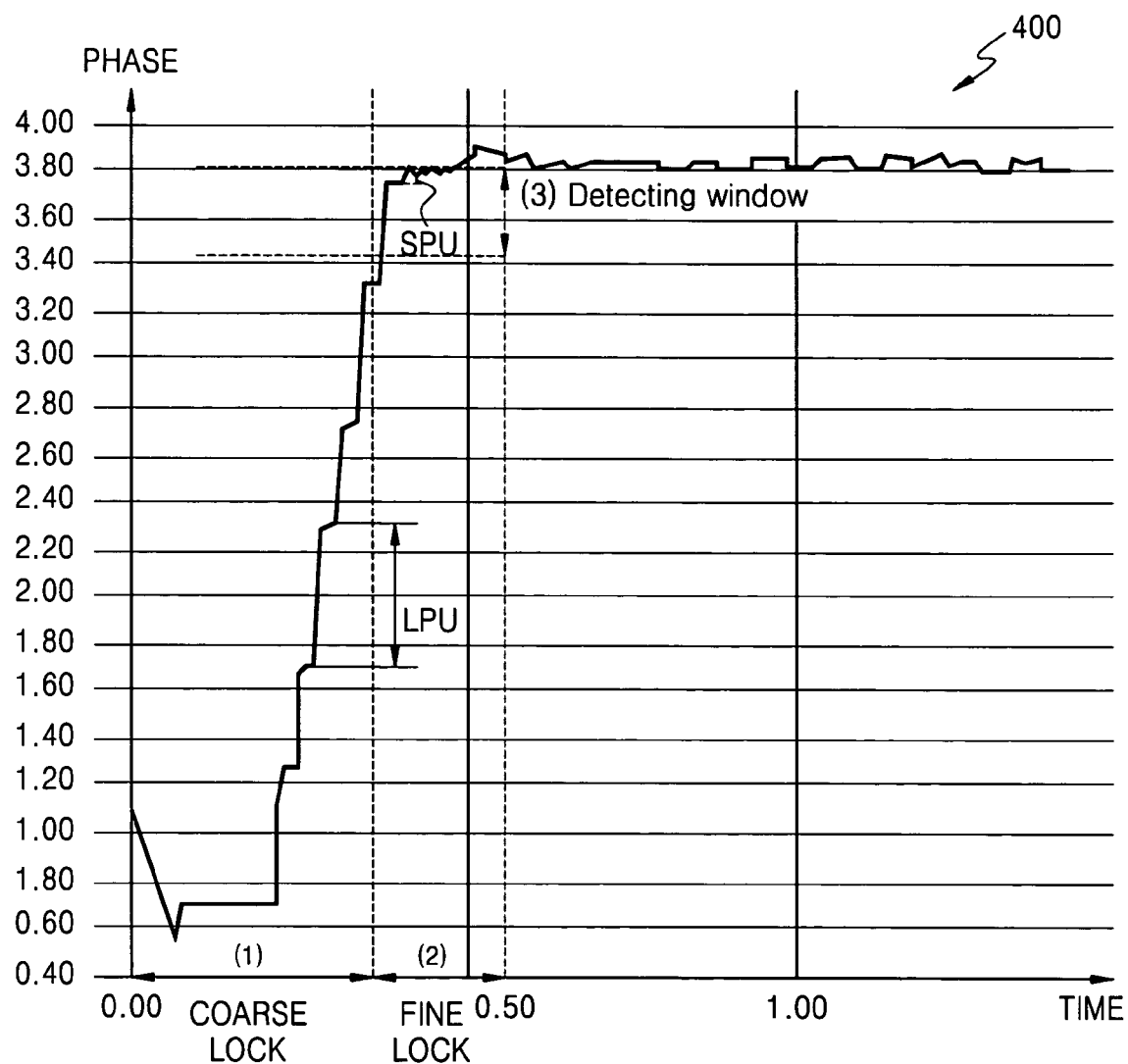
FIG. 4 is a graph showing a phase locking operation of the delay locked loop 100 of FIG. 1.
Figure 5:
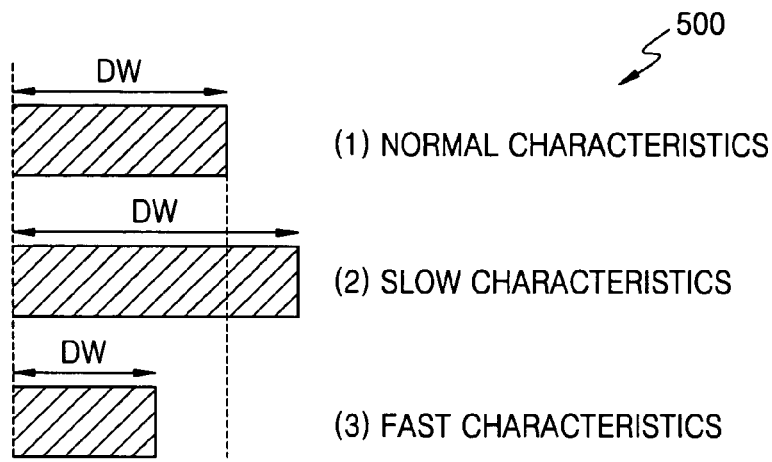
FIG. 5 shows changes of the detecting window.

The logic levels of the first phase control signal PCS1 and the second phase control signal PCS2 depend on whether the rising edge PREF of the reference clock signal REFCLK of FIG. 3 is in the detecting window DW of the feedback clock signal FBCLK. The phase controller 610 is controlled according to changes in the logic levels of the first phase control signal PCS1 and the second phase control signal PCS2.

The phase controller 610 performs a fine phase locking operation, which adjusts the phase of the reference clock signal REFCLK by making fine adjustments to the phase in small phase units, and a coarse phase locking operation, which adjusts the phase of the reference clock signal REFCLK by making coarse adjustments to the phase in large phase units, in response to the first and second phase control signals PCS1 and PCS2 to match the phase of the reference clock signal REFCLK and the phase of the feedback clock signal FBCLK.

Before the detecting window DW of the feedback clock signal FBCLK approaches to the rising edge PREF of the reference clock signal REFCLK, the phase controller 610 adjusts the phase of the reference clock signal REFCLK by making coarse adjustments to the phase in large phase units. Therefore, the feedback clock signal FBCLK is also moved in large phase units.

If the rising edge PREF of the reference clock signal REFCLK goes into the detecting window DW of the feedback clock signal FBCLK, the phase controller 610 adjusts the phase of the reference clock signal REFCLK by making fine adjustments to the phase in small phase units. Therefore, the feedback clock signal FBCLK is moved in small phase units. Finally, the feedback clock signal FBCLK synchronizes with the reference clock signal REFCLK.

Likewise, since a detecting window controller is made up of differential amplifiers and the differential amplifiers are controlled using a constant current of a current signal, a detecting window can always be kept constant without regard to external conditions.

As described above, a delay locked loop according to the present disclosure keeps a detecting window constant despite changes in external voltage, temperature, and the manufacturing process.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. A delay locked loop comprising:
a phase controller, which controls a phase of a reference clock signal in response to first and second phase control signals; and
a phase detector, which compares the phase of the reference clock signal to a phase of a feedback clock signal and outputs the first and second phase control signals, which are used by the phase controller to match the phase of the reference clock signal and the phase of the feedback clock signal,
wherein the phase detector keeps the length of a detecting window constant in response to a current signal.

2. The delay locked loop of claim 1, wherein the phase detector comprises:
a detecting window controller, which generates the delay feedback clock signal that delays the feedback clock signal for a predetermined time in response to the current signal; and
a phase sensing unit, which generates the first phase control signal by comparing the phase of the feedback clock signal to the phase of the reference clock signal and generates the second phase control signal by comparing the phase of the delay feedback clock signal to the phase of the reference clock signal.

3. A delay locked loop for matching a phase of a reference clock signal and a phase of a feedback clock signal, comprising:
a detecting window controller, which generates the delay feedback clock signal that delays a feedback clock signal for a predetermined time in response to a current signal; and
a phase sensing unit, which generates a first phase control signal that controls the phase of the reference clock signal by comparing a phase of the feedback clock signal to the phase of the reference clock signal and a second phase control signal that controls the phase of the reference clock signal by comparing the phase of the delay feedback clock signal to the phase of the reference clock signal,
wherein the detecting window controller keeps constant a delay time from when the feedback clock signal is received to when the delay feedback clock signal is output.

4. A delay locked loop for matching a phase of a reference clock signal and a phase of a feedback clock signal, comprising:
a detecting window controller for generating a delay feedback clock signal that delays the feedback clock signal for a predetermined time in response to a current signal;
a first differential amplifier in signal communication with the detecting window controller, which receives and amplifies the feedback clock signal and an inverted feedback clock signal; and
a second differential amplifier in signal communication with the detecting window controller, which receives an output of the first differential amplifier and outputs an amplified signal as the delay feedback clock signal,
wherein the first differential amplifier and the second differential amplifier keep substantially constant a delay time from when the feedback clock signal is received to when the delay feedback clock signal is output.

5. The delay locked loop of claim 4, wherein the delay locked loop further comprises:
a current generator, which outputs the current signal, wherein the current generator generates the current of the current signal constant despite changes in external voltage, temperature, and the manufacturing process.

6. The delay locked loop of claim 5, wherein the current generator increases or decreases the current of the current signal in response to a mode register set (MRS).

7. A delay locked loop comprising:
a phase controller, which controls a phase of a reference clock signal in response to first and second phase control signals; and
a phase detector, which compares the phase of the reference clock signal to a phase of a feedback clock signal and outputs the first and second phase control signals, which are used by the phase controller to match the phase of the reference clock signal and the phase of the feedback clock signal,
wherein the phase detector keeps the length of a detecting window constant in response to a current signal,
wherein the phase detector comprises:
a detecting window controller, which generates the delay feedback clock signal that delays the feedback clock signal for a predetermined time in response to the current signal; and
a phase sensing unit, which generates the first phase control signal by comparing the phase of the feedback clock signal to the phase of the reference clock signal and generates the second phase control signal by comparing the phase of the delay feedback clock signal to the phase of the reference clock signal,
wherein the detecting window controller comprises:
a first differential amplifier, which receives and amplifies the feedback clock signal and an inverted feedback clock signal that is an inverted version of the feedback clock signal; and
a second differential amplifier, which receives and amplifies an output of the first differential amplifier and outputs the amplified signal as the delay feedback clock signal,
wherein the first differential amplifier and the second differential amplifier keep constant a delay time from when the feedback clock signal is received to when the delay feedback clock signal is output, in response to the current signal.

8. The delay locked loop of claim 7, wherein the detecting window controller may include a plurality of differential amplifier pairs, each pair composed of the first differential amplifier and the second differential amplifier.

9. The delay locked loop of claim 7, wherein the first differential amplifier comprises:
a first resistor, a first terminal of which is connected to a power source voltage;
a first transistor, a first terminal of which is connected to a second terminal of the first resistor and a gate of which receives the feedback clock signal;
a second resistor, a first terminal of which is connected to the power source voltage;
a second transistor, a first terminal of which is connected to a second terminal of the second resistor and a gate of which receives the inverted feedback clock signal; and
a first driving transistor, a first terminal of which is commonly connected to a second terminal of the first transistor and a second terminal of the second transistor and a gate of which receives the current signal,
the second differential amplifier comprises:
a third resistor, a first terminal of which is connected to the power source voltage;
a third transistor, a first terminal of which is connected to a second terminal of the third resistor and a gate of which is connected to the first terminal of the first transistor;
a fourth resistor, a first terminal of which is connected to the power source voltage;
a fourth transistor, a first terminal of which is connected to a second terminal of the fourth resistor and a gate of which is connected to the first terminal of the second transistor; and
a second driving transistor, a first terminal of which is commonly connected to a second terminal of the third transistor and a second terminal of the fourth transistor and a gate of which receives the current signal, and
the delay feedback clock signal is output from the first terminal of the third transistor.

10. The delay locked loop of claim 9, wherein the first differential amplifier further comprises:
a first operation control transistor, which is connected in series between the second terminal of the first transistor and a first terminal of the first driving transistor and a gate of which receives an operation control signal; and
a second operation control transistor, which is connected in series between the second terminal of the second transistor and the first terminal of the first driving transistor and a gate of which receives the operation control signal,
the second differential amplifier further comprises:
a third operation control transistor, which is connected in series between the second terminal of the third transistor and a first terminal of the second driving transistor and a gate of which receives the operation control signal; and
a fourth operation control transistor, which is connected in series between the second terminal of the fourth transistor and the first terminal of the second driving transistor and a gate of which receives the operation control signal, and
the first differential amplifier and the second differential amplifier are turned on/off in response to the operation control signal.

11. The delay locked loop of claim 7, wherein the phase sensing unit comprises:
a first comparator, which compares the phase of the reference clock signal to the phase of the feedback clock signal;
a first latch, which latches an output of the first comparator and outputs the latched signal as the first phase control signal;
a second comparator, which compares the phase of the reference clock signal to the phase of the delay feedback clock signal; and
a second latch, which latches an output of the second comparator and outputs the latched signal as the second phase control signal.

12. The delay locked loop of claim 7, wherein the phase controller performs a fine phase locking operation to progressively adjust the phase of the reference clock signal by a small phase unit and a coarse phase locking operation to progressively adjust the phase of the reference clock signal by a large phase unit in response to the first and second phase control signals in order to match the phase of the reference clock signal and the phase of the feedback clock signal.

13. The delay locked loop claim 12, wherein the detecting window lasts for a predetermined period of time and starts from when the phase controller starts to perform the fine phase locking operation.

14. The delay locked loop of claim 7, wherein the current of the current signal is constant.

15. The delay locked loop of claim 7, wherein the detecting window is a phase difference between a rising edge of the feedback clock signal and a rising edge of a delay feedback clock signal.

16. A delay locked loop for matching a phase of a reference clock signal and a phase of a feedback clock signal, comprising:
a detecting window controller, which generates the delay feedback clock signal that delays a feedback clock signal for a predetermined time in response to a current signal; and
a phase sensing unit, which generates a first phase control signal that controls the phase of the reference clock signal by comparing a phase of the feedback clock signal to the phase of the reference clock signal and a second phase control signal that controls the phase of the reference clock signal by comparing the phase of the delay feedback clock signal to the phase of the reference clock signal,
wherein the detecting window controller keeps constant a delay time from when the feedback clock signal is received to when the delay feedback clock signal is output,
wherein the detecting window controller comprises:
a first differential amplifier, which receives and amplifies the feedback clock signal and an inverted feedback clock signal that is an inverted version of the feedback clock signal; and
a second differential amplifier, which receives and amplifies an output of the first differential amplifier and outputs the amplified signal as the delay feedback clock signal.

17. The delay locked loop of claim 16, wherein the phase sensing unit comprises:
a first comparator, which compares the phase of the reference clock signal to the phase of the feedback clock signal;
a first latch, which latches an output of the first comparator and outputs the latched signal the first phase control signal;
a second comparator, which compares the phase of the reference clock signal to the phase of the delay feedback clock signal; and
a second latch, which latches an output of the second comparator and outputs the latched signal as the second phase control signal.

18. The delay locked loop of claim 16, wherein the first differential amplifier comprises:
a first resistor, a first terminal of which is connected to a power source voltage;
a first transistor, a first terminal of which is connected to a second terminal of the first resistor and a gate of which receives the feedback clock signal;
a second resistor, a first terminal of which is connected to the power source voltage;
a second transistor, a first terminal of which is connected to a second terminal of the second resistor and a gate of which receives the inverted feedback clock signal; and
a first driving transistor, a first terminal of which is commonly connected to a second terminal of the first transistor and a second terminal of the second transistor and a gate of which receives the current signal,
the second differential amplifier comprises:
a third resistor, a first terminal of which is connected to the power source voltage;
a third transistor, a first terminal of which is connected to a second terminal of the third resistor and a gate of which is connected to the first terminal of the first transistor;
a fourth resistor, a first terminal of which is connected to the power source voltage;
a fourth transistor, a first terminal of which is connected to a second terminal of the fourth resistor and a gate of which is connected to the first terminal of the second transistor; and
a second driving transistor, a first terminal of which is commonly connected to a second terminal of the third transistor and a second terminal of the fourth transistor and a gate of which receives the current signal, and
the delay feedback clock signal is output from the first terminal of the third transistor.

19. The delay locked loop of claim 18, wherein the detecting window controller further comprises:
a first operation control transistor, which is connected in series between the second terminal of the first transistor and a first terminal of the first driving transistor and a gate of which receives an operation control signal; and
a second operation control transistor, which is connected in series between the second terminal of the second transistor and the first terminal of the first driving transistor and a gate of which receives the operation control signal;
a third operation control transistor, which is connected in series between the second terminal of the third transistor and a first terminal of the second driving transistor and a gate of which receives the operation control signal; and
a fourth operation control transistor, which is connected in series between the second terminal of the fourth transistor and the first terminal of the second driving transistor and a gate of which receives the operation control signal,
wherein the first differential amplifier and the second differential amplifier are turned on/off in response to the operation control signal.

20. The delay locked loop of claim 16, wherein the delay locked loop further comprises:
a current generator, which outputs the current signal,
wherein the current generator generates the current of the current signal constant despite changes in external voltage, temperature, and the manufacturing process.

21. The delay locked loop of claim 20, wherein the current generator increases or decreases the current of the current signal in response to a mode register set (MRS).

* * * * *